US010225497B2

(12) United States Patent
Sano et al.

(10) Patent No.: US 10,225,497 B2
(45) Date of Patent: Mar. 5, 2019

(54) SOLID-STATE IMAGING DEVICE AND ELECTRONIC DEVICE WITH SYMMETRICAL TRANSISTOR GROUPS

(71) Applicant: SONY CORPORATION, Tokyo (JP)

(72) Inventors: Takuya Sano, Tokyo (JP); Toshifumi Wakano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/559,914

(22) PCT Filed: Mar. 24, 2016

(86) PCT No.: PCT/JP2016/059321
§ 371 (c)(1),
(2) Date: Sep. 20, 2017

(87) PCT Pub. No.: WO2016/163240
PCT Pub. Date: Oct. 13, 2016

(65) Prior Publication Data
US 2018/0098007 A1    Apr. 5, 2018

(30) Foreign Application Priority Data
Apr. 7, 2015 (JP) ................. 2015-078171

(51) Int. Cl.
*H04N 5/359* (2011.01)
*H01L 27/146* (2006.01)
(Continued)

(52) U.S. Cl.
CPC ......... *H04N 5/3595* (2013.01); *H01L 27/146* (2013.01); *H01L 27/14609* (2013.01);
(Continued)

(58) Field of Classification Search
CPC .................. H04N 5/3595; H04N 5/355; H01L 27/14609; H01L 27/14645
See application file for complete search history.

(56) References Cited

U.S. PATENT DOCUMENTS

2006/0231739 A1    10/2006    Sekine et al.
2007/0058062 A1    3/2007    Ohta
(Continued)

FOREIGN PATENT DOCUMENTS

EP    2563011    2/2013
JP    2006-302970 A    11/2006
(Continued)

OTHER PUBLICATIONS

International Search Report prepared by the Japan Patent Office dated May 19, 2016, for International Application No. PCT/JP2016/059321.
(Continued)

*Primary Examiner* — Padma Haliyur
(74) *Attorney, Agent, or Firm* — Sheridan Ross P.C.

(57) ABSTRACT

The present disclosure relates to a solid-state imaging device and an electronic device for suppressing deterioration of pixel characteristics while guaranteeing the operating range of VSLs. A solid-state imaging device according to a first aspect of this disclosure has multiple pixel sharing units each including multiple photoelectric conversion sections each configured to correspond to a pixel, an accumulation section configured to be shared by the plurality of photoelectric conversion sections and to accumulate charges generated thereby, and multiple transistors configured to control reading of the charges accumulated in the accumulation section. The plurality of transistors in each pixel sharing unit are arranged symmetrically. The plurality of transistors include a transistor that functions as a switch to change
(Continued)

conversion efficiency. The present disclosure may be applied to back-illuminated CMOS image sensors, for example.

20 Claims, 15 Drawing Sheets

(51) Int. Cl.
  *H04N 5/355* (2011.01)
  *H04N 5/3745* (2011.01)
(52) U.S. Cl.
  CPC ....... *H01L 27/14645* (2013.01); *H04N 5/355* (2013.01); *H04N 5/3559* (2013.01); *H04N 5/37457* (2013.01)

(56) References Cited

U.S. PATENT DOCUMENTS

| | | |
|---|---|---|
| 2008/0303930 A1 | 12/2008 | Kuroda et al. |
| 2009/0295973 A1 | 12/2009 | Oshikubo et al. |
| 2011/0134296 A1 | 6/2011 | Kuroda et al. |
| 2013/0001403 A1 | 1/2013 | Yamakawa |
| 2013/0049082 A1 | 2/2013 | Kato et al. |
| 2013/0140608 A1 | 6/2013 | Kuroda et al. |
| 2013/0235243 A1* | 9/2013 | Sano ................ H04N 5/374 348/308 |
| 2014/0151531 A1 | 6/2014 | Yamashita |
| 2015/0155316 A1 | 6/2015 | Kuroda et al. |

FOREIGN PATENT DOCUMENTS

| | | |
|---|---|---|
| JP | 2007-81033 A | 3/2007 |
| JP | 2008-270299 A | 11/2008 |
| JP | 2010-3995 A | 1/2010 |
| JP | 2013-33896 A | 2/2013 |
| JP | 2013-62789 A | 4/2013 |
| JP | 2013-197333 A | 9/2013 |
| JP | 2014-112580 A | 6/2014 |

OTHER PUBLICATIONS

Extended European Search Report for European Patent Application No. 16776408.3, dated Aug. 31, 2018, 8 pages.

\* cited by examiner

FD WIRING SURROUNDED BY SiO ⇒ CHANGED TO AIR GAP

SOLID-STATE IMAGING DEVICE AND ELECTRONIC DEVICE WITH SYMMETRICAL TRANSISTOR GROUPS

CROSS REFERENCE TO RELATED APPLICATIONS

This application is a national stage application under 35 U.S.C. 371 and claims the benefit of PCT Application No. PCT/JP2016/059321 having an international filing date of 24 Mar. 2016, which designated the United States, which PCT application claimed the benefit of Japanese Patent Application No. 2015-078171 filed 7 Apr. 2015, the disclosures of which are incorporated herein by reference in their entirety.

TECHNICAL FIELD

The present disclosure relates to a solid-state imaging device and an electronic device. More particularly, the disclosure relates to a solid-state imaging device and an electronic device adapted to refine the pixel size and lower drive power.

BACKGROUND ART

In solid-state imaging devices typified by complementary metal oxide semiconductor (CMOS) image sensors, the increasing number of pixels has been accompanied by a marked tendency to refine the pixel size. In the case of back-illuminated CMOS image sensors, in particular, various layouts for pixel sharing have been proposed by taking advantage of a high degree of freedom in layout design. The sharing involves, for example, allowing multiple pixels (i.e., their corresponding photodiodes (PDs)) to share a floating diffusion (FD) region and various pixel transistors.

However, the layout of pixel transistors and other components is subject to constraints where the pixel size is refined to approximately 1 μm, for example, even if the above-mentioned pixel sharing technology is used. Specifically, if design is such that the aperture ratio of PDs is maximized to accommodate the increasingly refined pixel size, the area occupied by pixel transistors needs to be reduced correspondingly. In that case, the characteristics such as sensitivity (output) of multiple pixels that share FD regions can become uneven.

In the past, such irregularities have been suppressed using various gates (pixel transistors) with symmetric densities and a symmetric source (S)/drain (D) layout to reduce differences in sensitivity between the pixels sharing FD regions (e.g., see PTL 1).

FIG. 1 illustrates a typical layout of a pixel sharing unit in a back-illuminated CMOS image sensor disclosed by PTL 1, the unit having eight pixels (i.e., their corresponding PDs) sharing two FD regions.

Each pixel sharing unit 110 is made up of a first light receiving section 21, a second light receiving section 22, a first transistor group 31, and a second transistor group 32. The pixel sharing unit 110 further includes a first well contact 23a corresponding to the first light receiving section 21 and a second well contact 23b corresponding to the second light receiving section 22.

The first light receiving section 21 is made up of four PDs 111 to 114, an FD region 16a shared by the PDs 111 to 114, and transfer gates 121a to 124a for connecting each of the PDs 111 to 114 with the FD region 16a.

Likewise, the second light receiving section 22 is made up of four PDs 115 to 118, an FD region 16b shared by the PDs 115 to 118, and transfer gates 125a to 128a for connecting each of the PDs 115 to 118 with the FD region 16b.

The first transistor group 31 is made up of an amplifier gate 13a, a selector gate 15a, and S/D regions 31a to 31c. These components form a symmetrical layout in which an S/D region, a pixel transistor, an S/D region, a pixel transistor, and an S/D region are disposed in that order.

The second transistor group 32 is made up of a first reset gate 14a, a second reset gate 14b, and S/D regions 32a to 32c. As with the first transistor group 31, these components form a symmetrical layout in which an S/D region, a pixel transistor, an S/D region, a pixel transistor, and an S/D region are disposed in that order.

Normally, one reset gate would be sufficient. However, the second transistor group 32 is supplemented with a dummy reset gate to ensure layout symmetry with respect to the first transistor group 31. The added dummy reset gate makes the second transistor group 32 as wide as the first transistor group 31 having the same layout.

As illustrated in FIG. 1, the layout of the first light receiving section 21 and first transistor group 31 is symmetrical with respect to the layout of the second light receiving section 22 and second transistor group 32 in the pixel sharing unit 110. This reduces differences in sensitivity (output) between the pixels of the same color in each pixel sharing unit 110.

CITATION LIST

Patent Literature

[PTL 1]
Japanese Patent Laid-Open No. 2013-62789

SUMMARY

Technical Problem

Providing the dummy reset gate, however, can lead to the following problem: if two reset gates are used, they promote the influence of reset feed-through. The enhanced influence with two reset gates makes a vertical signal line (VSL) level lower than with one reset gate. This can result in worsening pixel characteristics.

The pixel sharing unit 110 in which eight pixels share two FD regions as illustrated in FIG. 1 may operate in added FD mode where the charges of the same color pixels accumulated in two FD regions are added up when output. Generally, CMOS image sensors are required to lower their drive power with a view to reducing power consumption.

Lowering drive power can affect the operating range of VSLs. Specifically, if the VSL level drops due to a lowered voltage, the amount of signal receivable by the VSLs is also lowered as illustrated in FIG. 2. In this state, operating the pixel sharing unit in the above-mentioned added FD mode reduces operating margins of the VSLs as illustrated in FIG. 3. Presumably, the amount of saturated signal will thereafter exceed the operating range of the VSLs, making the VSLs unable to receive the signal.

The present disclosure has been devised in view of the above circumstances. An object of the disclosure is therefore to suppress deterioration of pixel characteristics while guaranteeing the operating range of VSLs.

Technical Solution

According to a first aspect of the present disclosure, there is provided a solid-state imaging device including multiple pixel sharing units each including multiple photoelectric conversion sections each configured to correspond to a pixel, an accumulation section configured to be shared by the multiple photoelectric conversion sections and to accumulate charges generated thereby, and multiple transistors configured to control reading of the charges accumulated in the accumulation section. The multiple transistors in each of the pixel sharing units are arranged symmetrically. The multiple transistors include a transistor that functions as a switch to change conversion efficiency.

The transistor that functions as the switch may be configured to change the conversion efficiency by selectively enabling or disabling additional capacitance with respect to the accumulation section.

The additional capacitance may be configured to include the capacitance of the transistor that functions as the switch and diffusion capacitance.

The additional capacitance may be configured to include wiring capacitance.

Each of the pixel sharing units may be configured to include a plurality of the accumulation sections.

Each of the pixel sharing units may be configured to include eight of the photoelectric conversion sections each configured to correspond to a pixel, and two of the accumulation sections configured to be shared by four of the photoelectric conversion sections.

Each of the pixel sharing units may be configured to include accumulation section wiring configured to connect the accumulation sections. The accumulation section wiring may be configured to be surrounded by a hollow region.

At least part of device isolation may be accomplished using an oxide film.

Device isolation may be accomplished using ion implant.

According to a second aspect of the present disclosure, there is provided an electronic device including a solid-state imaging device having multiple pixel sharing units each configured to include multiple photoelectric conversion sections each configured to correspond to a pixel, an accumulation section configured to be shared by the multiple photoelectric conversion sections and to accumulate charges generated thereby, and multiple transistors configured to control reading of the charges accumulated in the accumulation section. The multiple transistors in each of the pixel sharing units are arranged symmetrically. The multiple transistors include a transistor that functions as a switch to change conversion efficiency.

Advantageous Effects of Invention

According to the first and the second aspects of the present disclosure, the deterioration of pixel characteristics is suppressed and the operating range of VSLs is guaranteed.

DESCRIPTION OF EMBODIMENTS

The best modes for carrying out the present disclosure (called the embodiments hereunder) are described below in detail with reference to the accompanying drawings.

Figure 4:
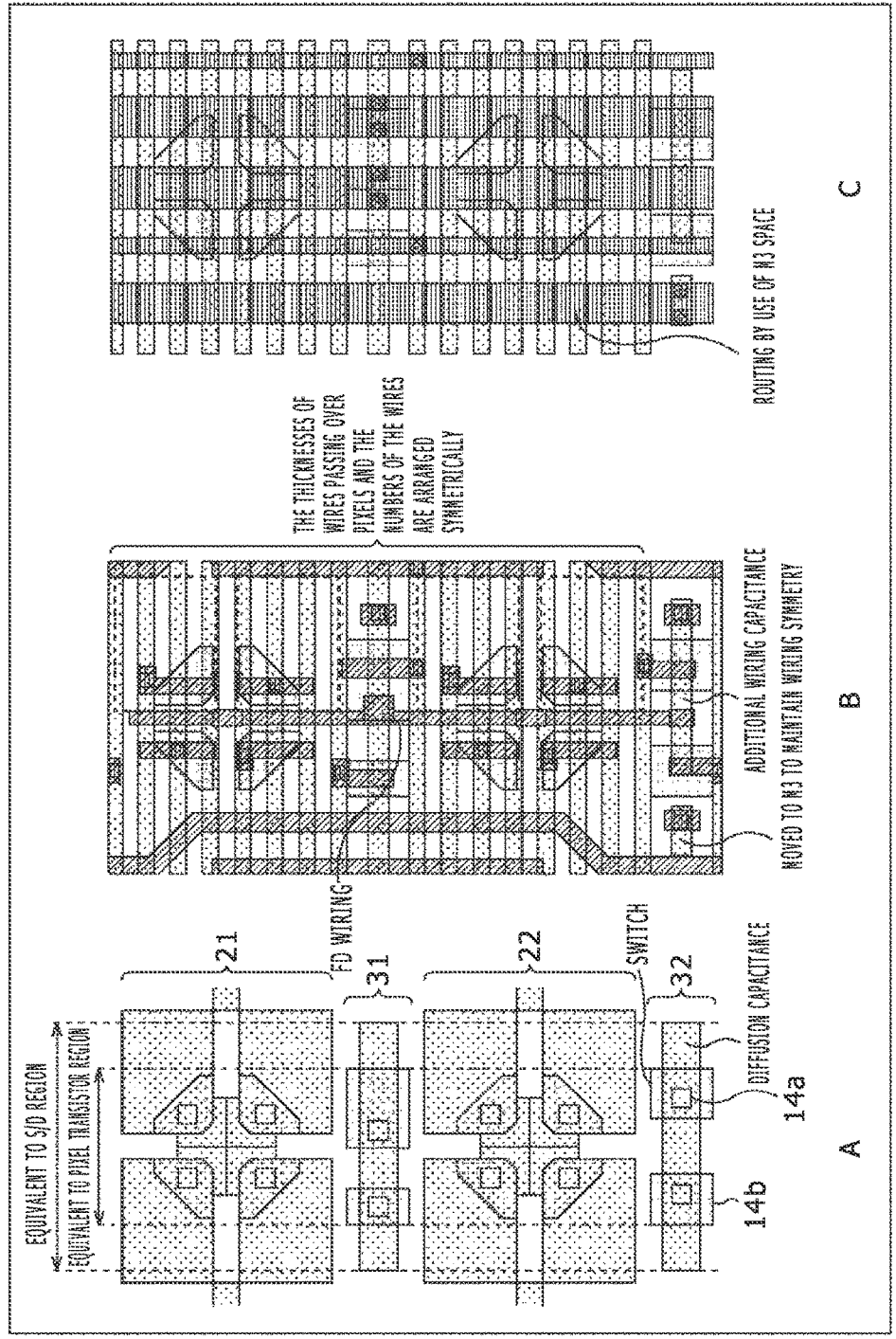
FIG. 4 is a layout diagram of a first configuration example of a pixel sharing unit to which the present disclosure is applied.

First Configuration Example of Pixel Sharing Unit to which Present Disclosure is Applied FIG. 4 illustrates a first configuration example of a pixel sharing unit in a back-illuminated CMOS image sensor as one embodiment of the present disclosure.

Figure 1:
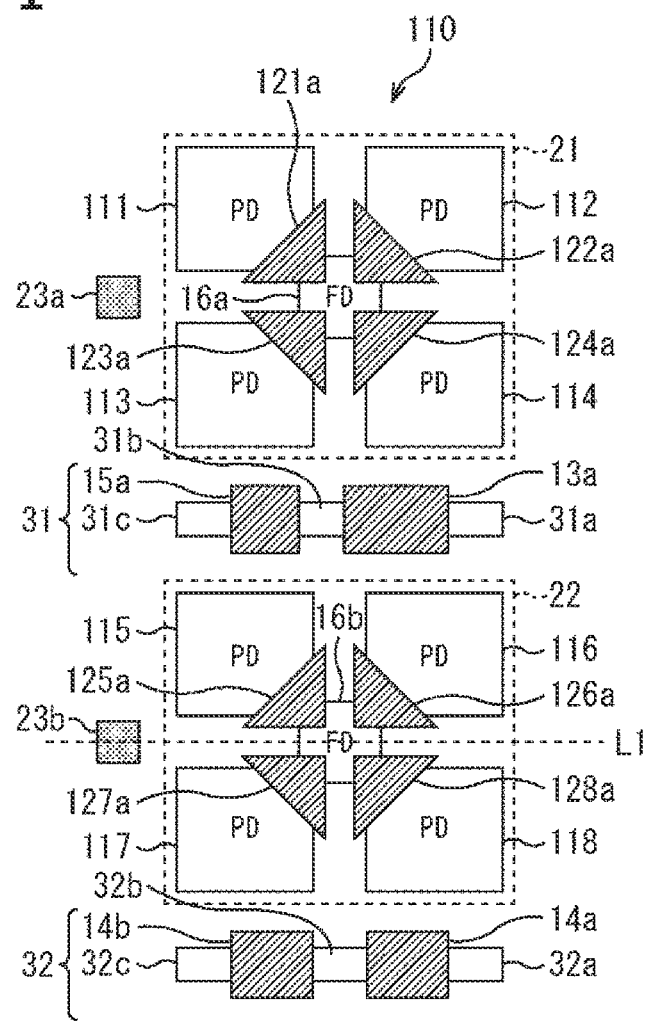
FIG. 1 is a layout diagram of an existing pixel sharing unit.
Figure 2:
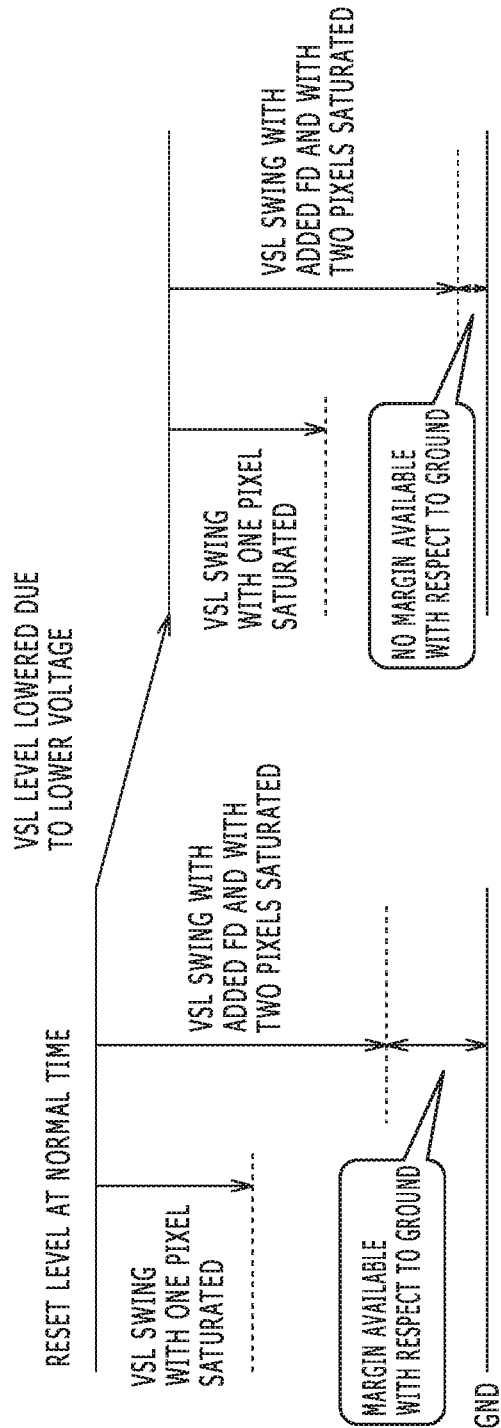
FIG. 2 is a schematic diagram explanatory of a problem encountered by the pixel sharing unit operating on a lower voltage.
Figure 3:
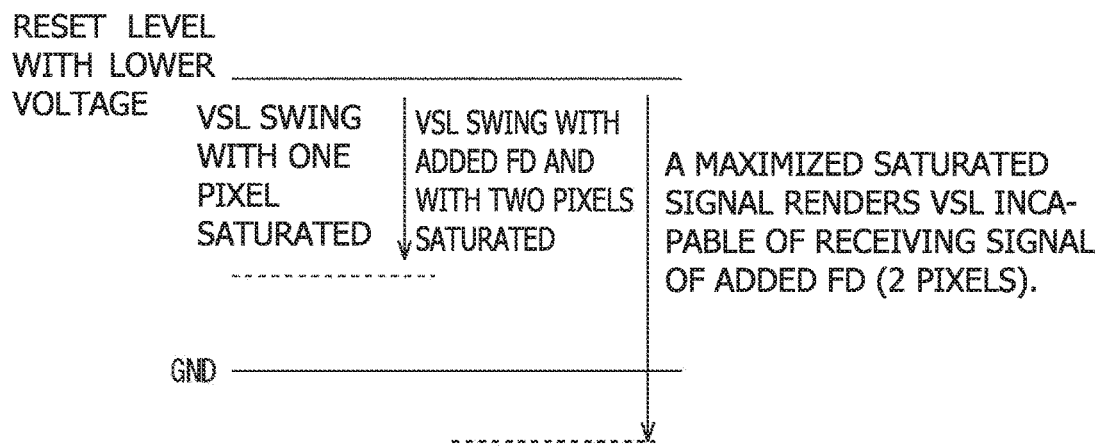
FIG. 3 is a schematic diagram explanatory of a problem encountered by the pixel sharing unit operating on a lower voltage in added FD mode.

The first configuration example, as with the pixel sharing unit 110 in FIG. 1, has two FD regions shared by eight pixels (PDs). In the first configuration example, the components substantially the same as those in the pixel sharing unit 110 of FIG. 1 are designated by the same reference symbols. Subfigure A in FIG. 4 illustrates a silicon (Si) substrate having a first light receiving section 21 and a second light receiving section 22 formed therein, as well as an inter-wiring layer film having a first transistor group 31 and a second transistor group 32 formed therein. Subfigure B in FIG. 4 illustrates a second metal (M2) layer in which FD wiring and other components are laid out. Subfigure C in FIG. 4 illustrates a third metal (M3) layer in which the wiring for use as wiring capacitance is laid out.

The first configuration example, as illustrated in Subfigure A of FIG. 4, has the first transistor group 31 and the second transistor group 32 forming a symmetrical layout in the same manner as the pixel sharing unit 110 indicated in FIG. 1.

As illustrated in Subfigure B of FIG. 4, the crosswise wiring in the M2 layer laid out in a manner overlapping with the first light receiving section 21 and the second light receiving section 22 is guaranteed symmetry in terms of wire thickness, wire positions, and wire count.

It is to be noted that in the first configuration example, a pixel transistor 14b, which is one of the two pixel transistors in the second transistor group 32, is used as a reset gate while the other pixel transistor 14a is used as an on/off switch. In the description that follows, the pixel transistor 14a for use as the switch may be referred to as the switch transistor 14a.

Turning on or off the switch transistor 14a enables or disables the additional capacitance that may be used in the form of FD regions. Turning on the switch transistor 14a enables the additional capacitance formed by the capacitance of the first reset transistor 14a, by diffusion capacitance, and by wiring capacitance. Turning off the switch transistor 14a disables the additional capacitance.

The wiring for use as the wiring capacitance laid out in the M2 layer in a position overlapping with the switch transistor 14a is also disposed in the M3 layer in a manner being guaranteed symmetry.

However, because the wiring pattern for the additional capacitance is added, the power to a reset drain is supplied using a metal electrode in another layer so as to ensure wiring layout symmetry over the pixels. A drain node may be either shared by the amplifier gate and the reset gate or provided using another system for each gate.

Figure 5:
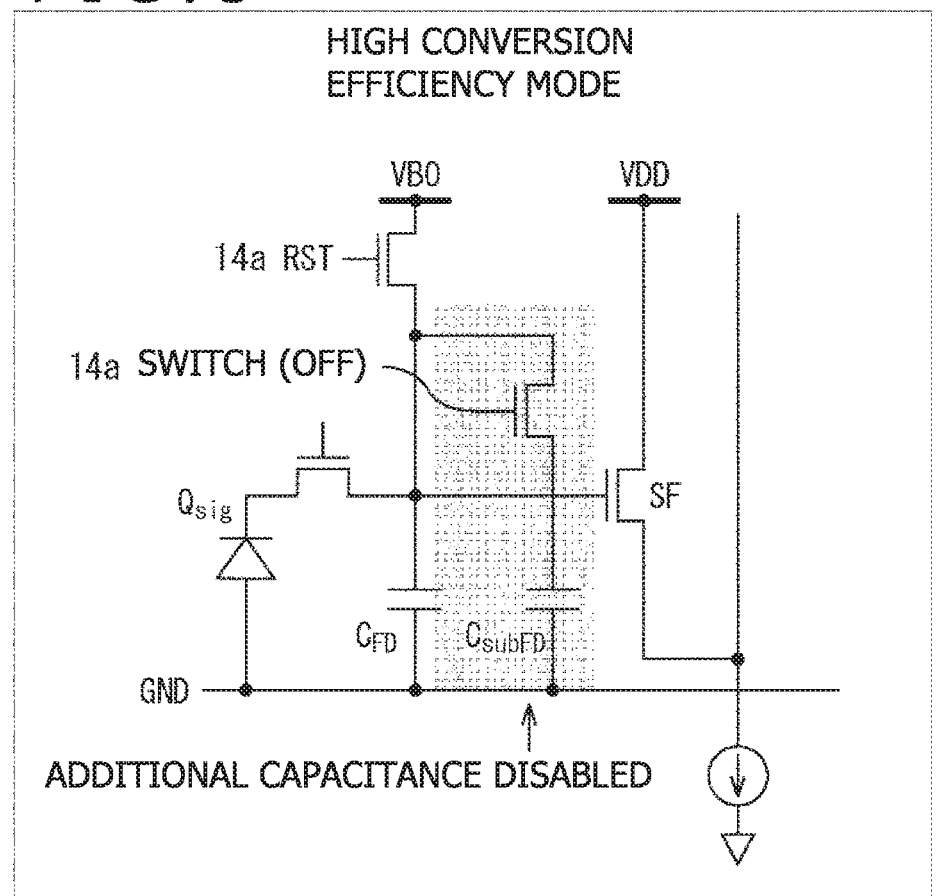
FIG. 5 is an equivalent circuit diagram applicable where a switch is turned on in the first configuration example.
Figure 6:
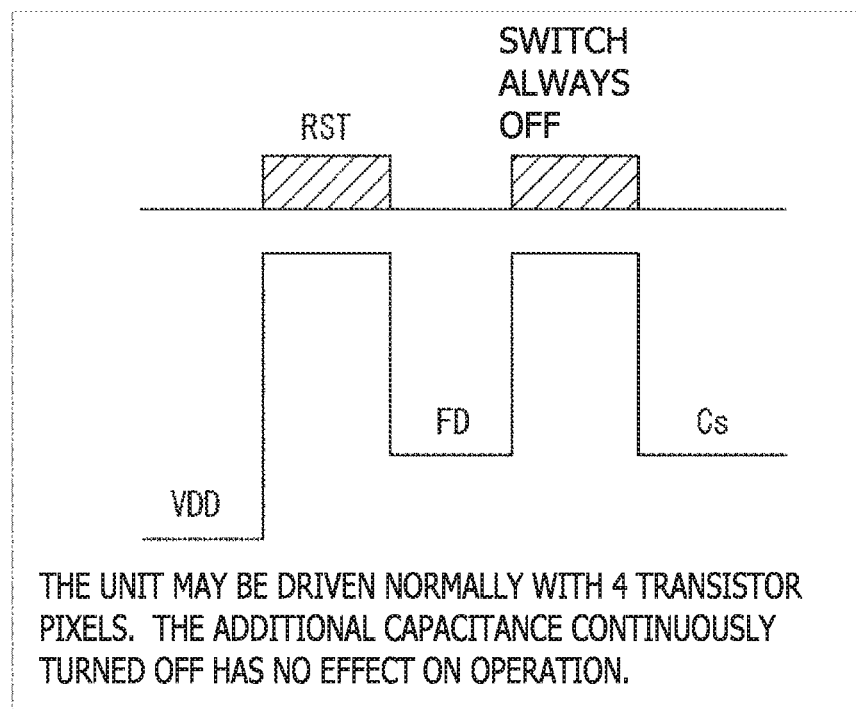
FIG. 6 is a schematic diagram illustrating an image, for illustration purposes, of the equivalent circuit of FIG. 5 being driven.
Figure 7:
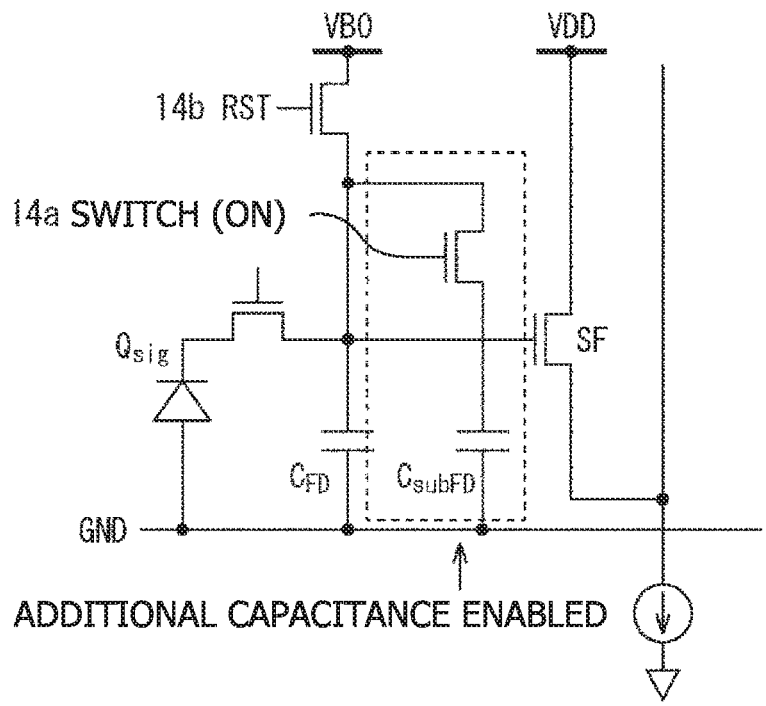
FIG. 7 is an equivalent circuit diagram applicable where a switch is turned on in the first configuration example.
Figure 8:
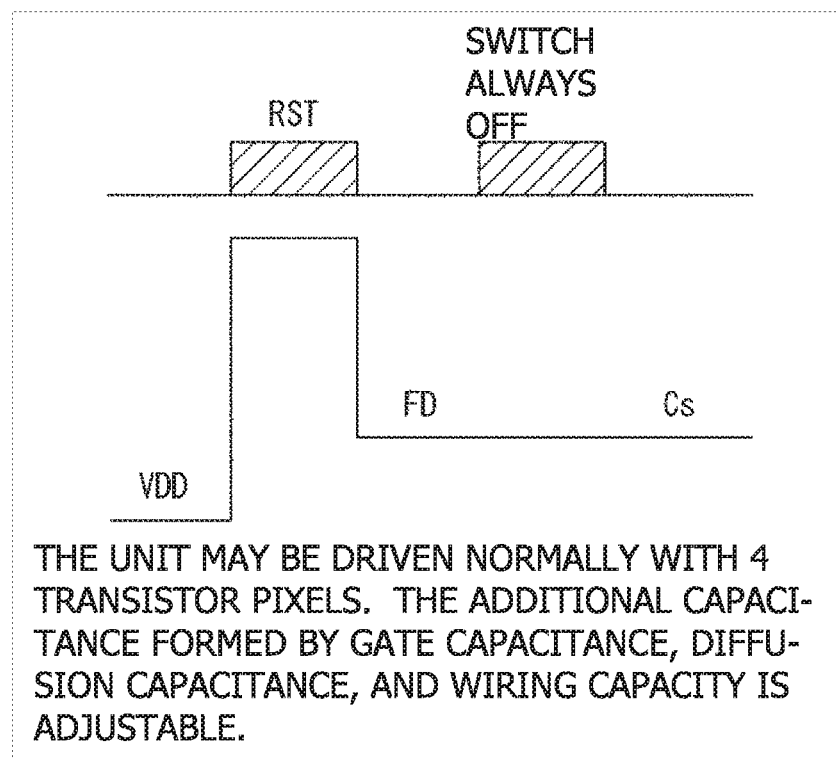
FIG. 8 is a schematic diagram illustrating an image, for illustration purposes, of the equivalent circuit of FIG. 7 being driven.

FIG. 5 illustrates an equivalent circuit applicable where the switch transistor 14a is turned off. FIG. 6 illustrates an image, for illustration purposes, of the equivalent circuit of FIG. 5 being driven. FIG. 7 illustrates an equivalent circuit applicable where the switch transistor 14a is turned on. FIG. 8 illustrates an image, for illustration purposes, of the equivalent circuit of FIG. 7 being driven.

As illustrated in FIG. 5, where high conversion efficiency mode is desired, the switch transistor 14a is turned off to disable the additional capacitance. For example, if high conversion efficiency mode is entered at the time of low illuminance, a high signal-noise (SN) ratio is obtained.

As illustrated in FIG. 7, where low conversion efficiency mode is desired, the switch transistor 14a is turned on to enable the additional capacitance. For example, if low conversion efficiency mode is entered at the time of high illuminance or during operation in added FD mode, the operating range of VSLs is guaranteed.

Figure 9:
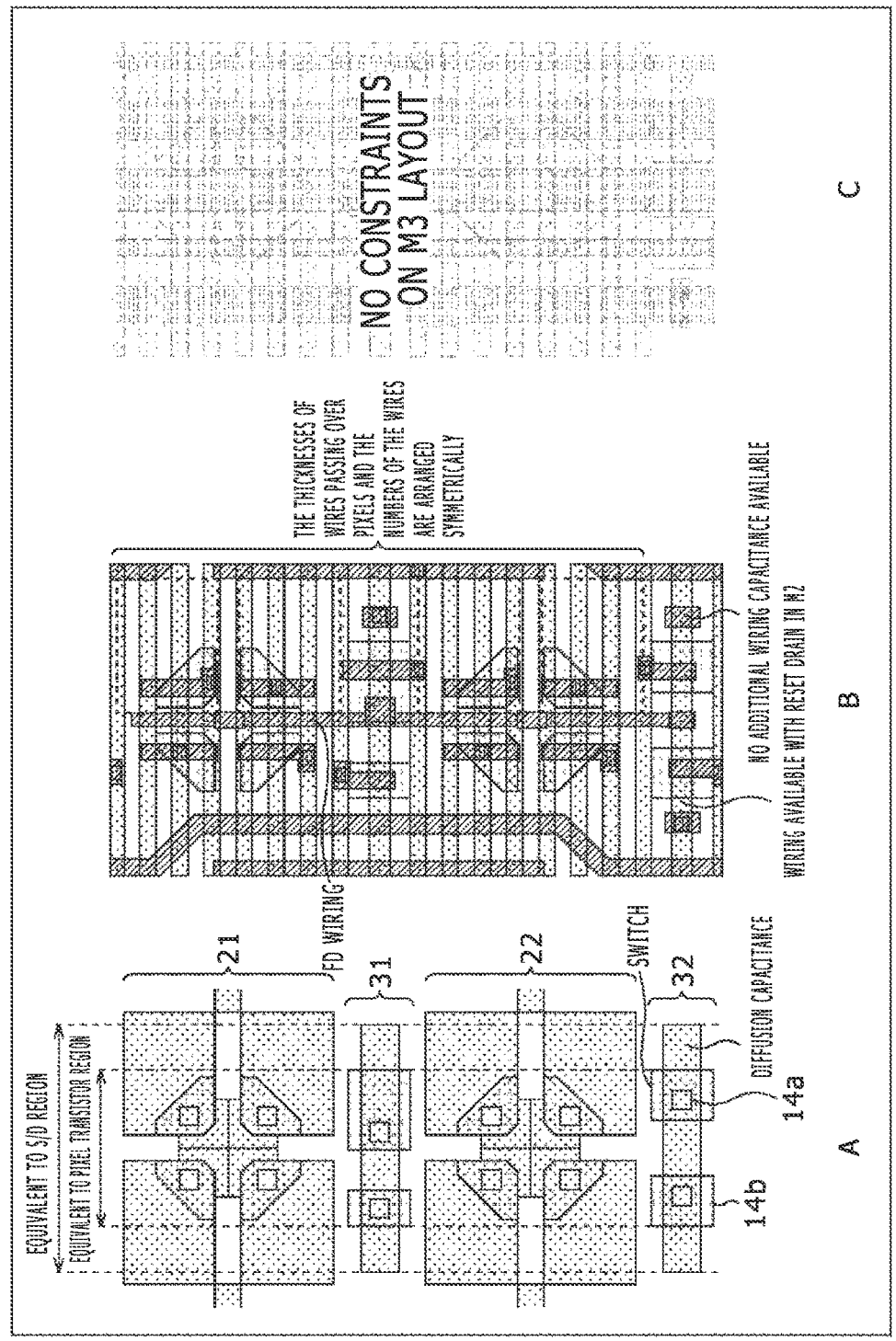
FIG. 9 is a layout diagram of a second configuration example of a pixel sharing unit to which the present disclosure is applied.

Second Configuration Example of Pixel Sharing Unit to which Present Disclosure is Applied FIG. 9 illustrates a second configuration example of a pixel sharing unit in a back-illuminated CMOS image sensor as another embodiment of the present disclosure.

In the second configuration example, the wiring of the M3 layer is not used as the additional capacitance. That is, where the switch transistor 14a is turned on in the second configuration example, both the capacitance of the first reset transistor 14a and the additional capacitance formed by the diffusion capacitance are enabled. In this case, symmetry is not required of the wiring layout in the M3 layer. This increases correspondingly the degree of freedom of that layout.

Figure 10:
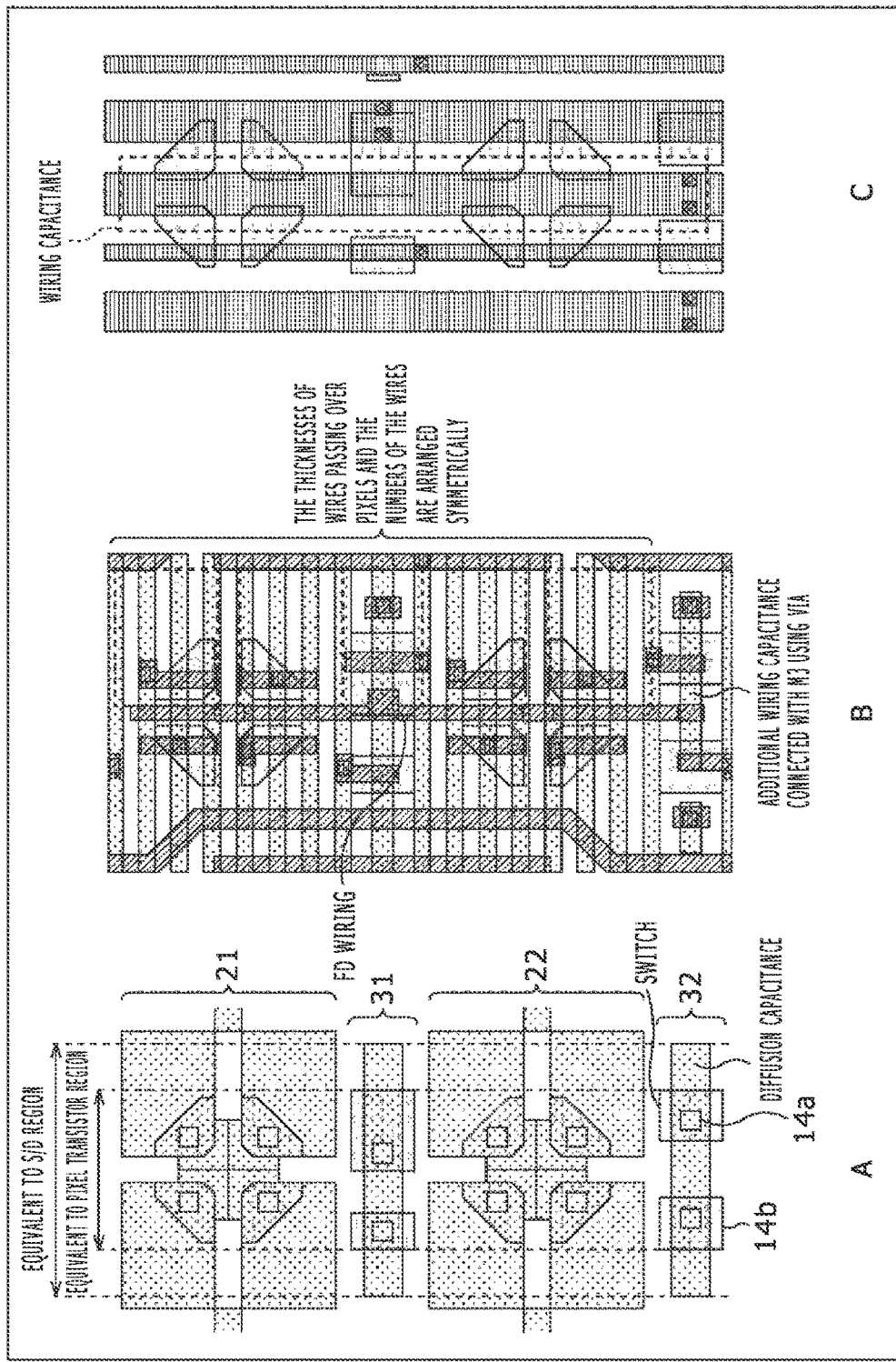
FIG. 10 is a layout diagram of a third configuration example of a pixel sharing unit to which the present disclosure is applied.
Figure 11:
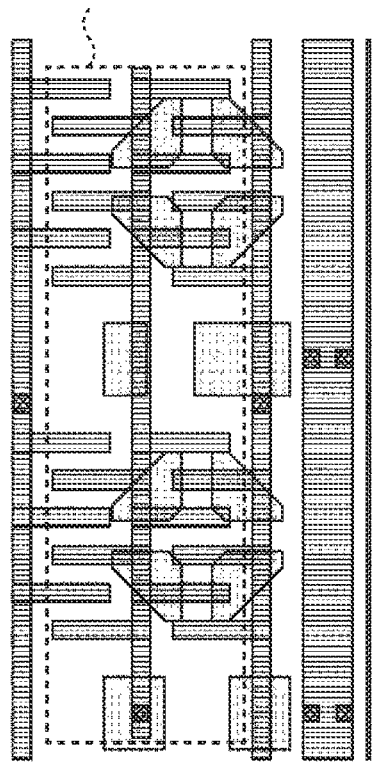
FIG. 11 is a schematic diagram illustrating a first extended example of the third configuration example in FIG. 10.
Figure 12:
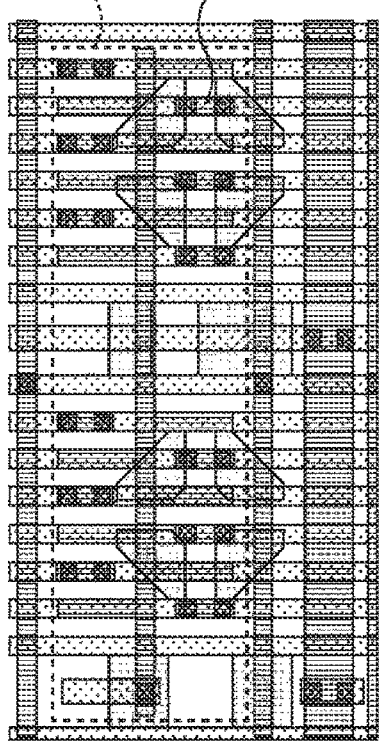
FIG. 12 is a schematic diagram illustrating a second extended example of the third configuration example in FIG. 10.

Third Configuration Example of Pixel Sharing Unit to which Present Disclosure is Applied FIGS. 10 to 12 illustrate a third configuration example of a pixel sharing unit in a back-illuminated CMOS image sensor as another embodiment of the present disclosure.

In the third configuration example, the wiring capacitance as the additional capacitance is raised with a suitably designed layout of the wiring in the M3 layer used as the additional capacitance in the first configuration example in FIG. 4.

That is, Subfigures A and B in FIG. 10 are similar to Subfigures A and B in FIG. 4, respectively. Subfigure C in FIG. 10 illustrates a basic pattern of the wiring laid out in the M3 layer of the third configuration example. FIG. 11 illustrates a first extended example of the wiring laid out in the M3 layer of the third configuration example. FIG. 12 illustrates a second extended example of the wiring laid out in the M3 layer of the third configuration example.

In the basic pattern illustrated in Subfigure C of FIG. 10, the wiring for use as the additional capacitance is laid out linearly in a longitudinal direction of the pixel sharing unit. It is to be noted, however, that the linear wire widths and linear wire positions may be modified as needed.

In the first extended example illustrated in FIG. 11, the wiring for use as the additional capacitance is laid out in a comb-tooth pattern. In other words, the longitudinally linear wiring of the pixel sharing unit is supplemented with crosswise wiring laid out symmetrically. This increases the wiring capacitance.

In the second extended example illustrated in FIG. 12, the wiring for use as the additional capacitance is also laid out in a comb-tooth pattern. With part of the transfer gate wiring raised to the M3 layer, the comb teeth formed in the M3 layer are given capacitance more efficiently, and the coupling capacitance between the transfer gates and the FD wiring is increased at the same time.

The basic patterns and the first and the second extended examples above are only examples. The widths and the lengths of the wiring may be modified as needed.

Figure 13:
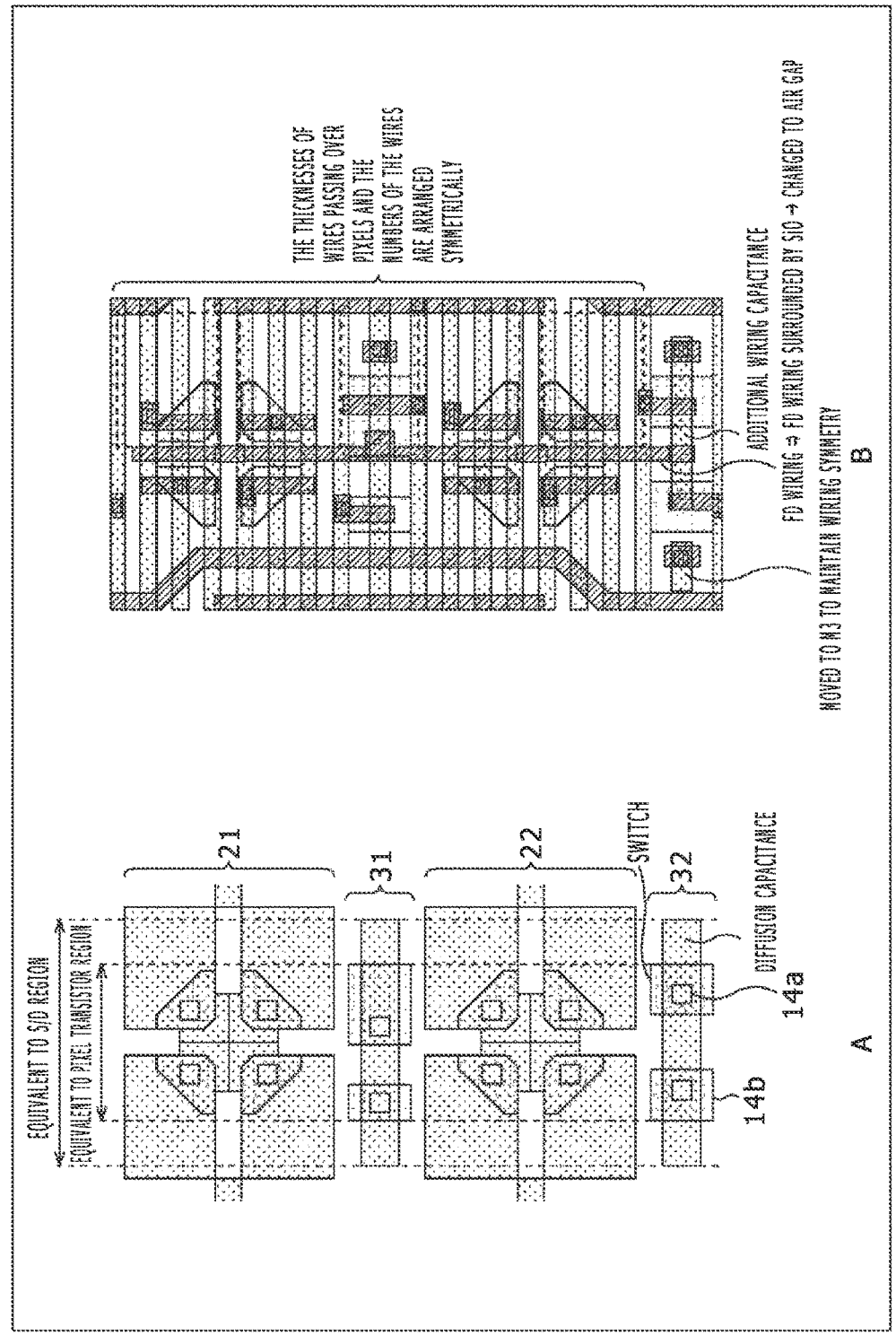
FIG. 13 is a layout diagram of a fourth configuration example of a pixel sharing unit to which the present disclosure is applied.
Figure 14:
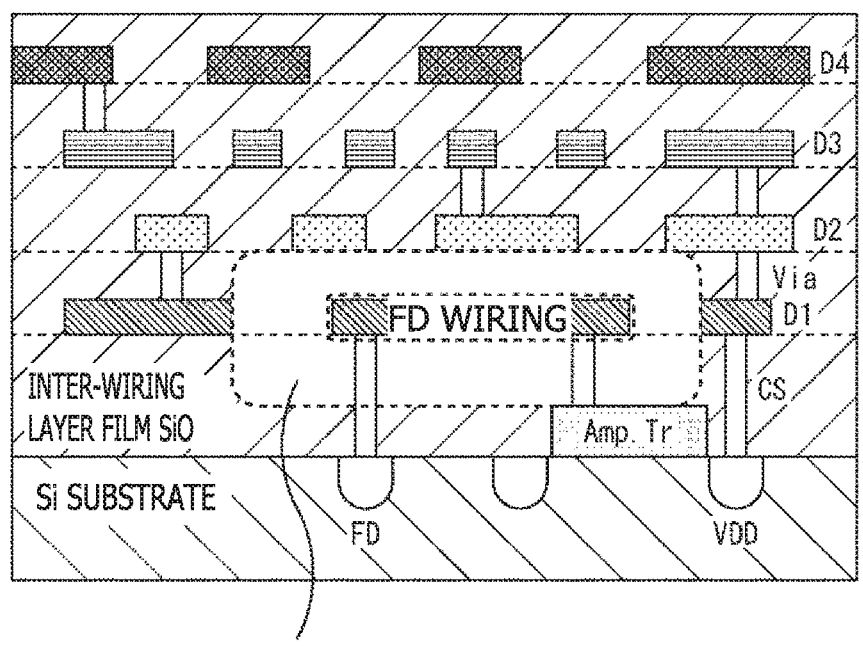
FIG. 14 is a cross-sectional diagram of the fourth configuration example in FIG. 13.

Fourth Configuration Example of Pixel Sharing Unit to which Present Disclosure is Applied Next, FIG. 13 illustrates a fourth configuration example of a pixel sharing unit in a back-illuminated CMOS image sensor as another embodiment of the present disclosure. FIG. 14 is a cross-sectional diagram of the fourth configuration example in FIG. 13.

In the fourth configuration example, as in the first configuration example of FIG. 4 or in the third configuration example of FIG. 12, turning on the switch transistor 14a enables the additional capacitance formed by the capacitance of the first reset transistor 14a, by diffusion capacitance, and by wiring capacitance. However, it is to be noted that the surroundings of the FD wiring connecting the FD region 16a with the FD region 16b are not filled with ordinary SiO but are at least partially left to be a hollow region (air gap).

The hollow region has one-fourth of the dielectric constant of SiO. That means the wiring capacitance may be reduced by approximately three-fourths, which raises conversion efficiency. Thus when hollow regions are suitably provided around the FD wiring, the design can be modified in such a manner as to further expand the range between high conversion efficiency mode and low conversion efficiency mode.

Alternatives to First Through the Fourth Configuration Examples of Pixel Sharing Unit to which Present Disclosure is Applied Device isolation in the first through the fourth configuration examples of the pixel sharing unit described above may be accomplished using ion implant (II) or with at least partial use of an oxide film.

If the oxide film is used for device isolation, PN junction capacitance is made smaller than if II is used. The use of the oxide film thus expands the range between high conversion efficiency mode and low conversion efficiency mode.

On the other hand, if II is used for device isolation, conversion efficiency is made lower than if an oxide film is used. However, the use of ion implant makes it easier to lay out miniaturized pixels.

Usage Examples of Image Sensor

Figure 15:
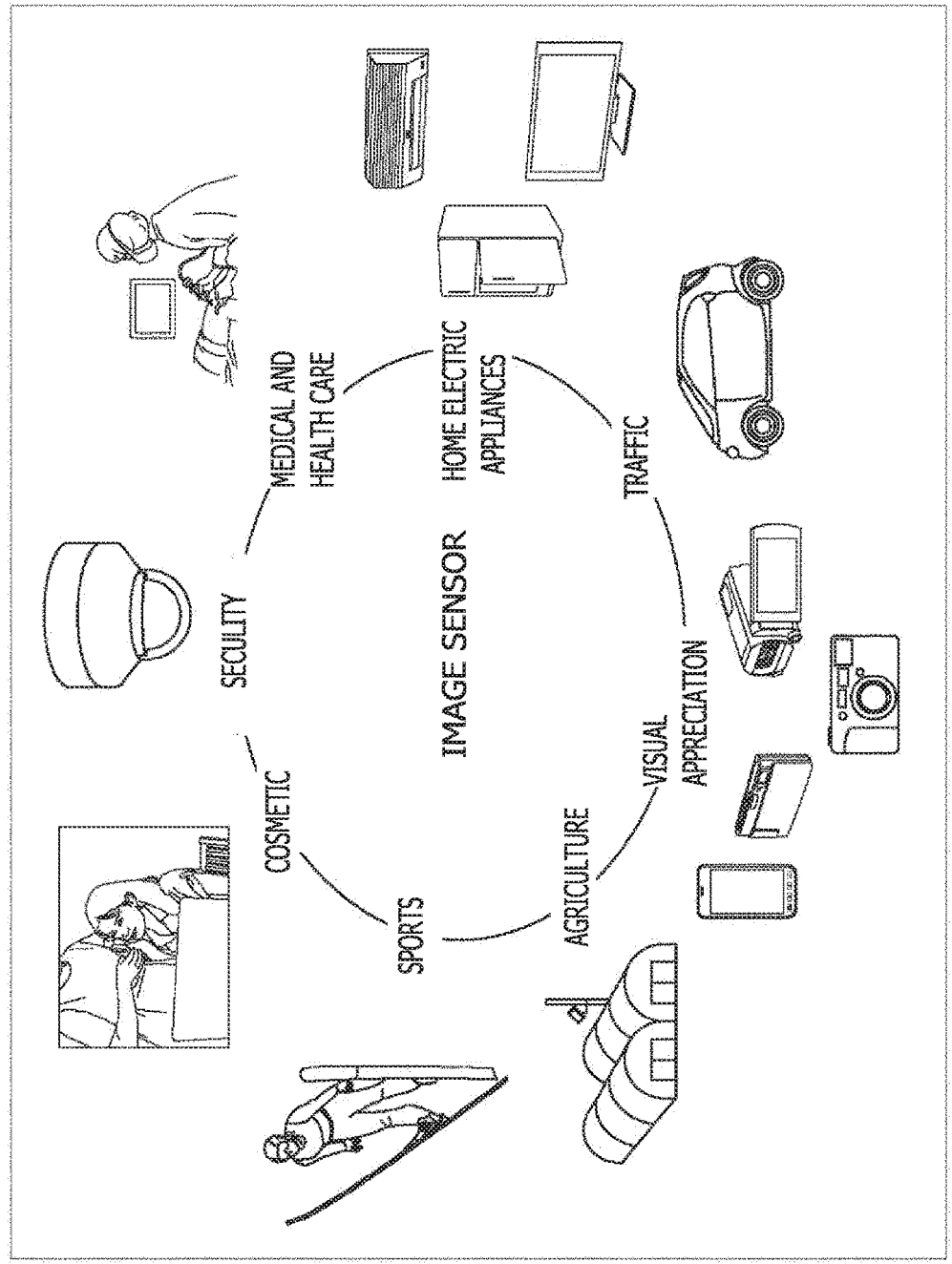
FIG. 15 is a schematic diagram illustrating usage examples of a CMOS image sensor to which the present disclosure is applied.

FIG. 15 is a schematic diagram illustrating usage examples of the CMOS image sensor to which the present disclosure is applied.

The MOS image sensor discussed above may be used in various cases outlined below, such as where diverse types of light including visible light, infrared light, ultraviolet radiation, or X-radiation are sensed by the image sensor.

- Devices that capture images for visual appreciation, such as digital cameras and camera function-equipped mobile devices.
- Traffic use devices including onboard sensors that capture images of the front side, rear side, surroundings, and interior of a vehicle to ensure safe operations such as automated vehicle stop and to recognize the driver's status; surveillance cameras for monitoring passing vehicles and the roads on which they travel; and distance measurement sensors for measuring the distance between vehicles.
- Devices that capture images of users' gestures to operate home electric appliances such as television (TV) sets, refrigerators, and air conditioners in a manner reflecting the gestures.
- Devices for medical and health care uses, such as endoscopes and instruments that capture images of blood vessels using received infrared radiation.
- Devices for security uses, such as surveillance cameras for crime prevention and cameras for personal authentication.
- Devices for cosmetic uses, such as skin measuring instruments and microscopes for capturing images of the scalp.
- Devices for sports uses, such as action cameras and wearable cameras for sports use.
- Devices for agriculture uses, such as surveillance cameras for monitoring fields and crops.

The present disclosure is not limited to the above-described embodiments that may be varied or modified diversely within the spirit and scope of the disclosure.

The present technology may be configured preferably as follows:

(1)
A solid-state imaging device including multiple pixel sharing units each including
multiple photoelectric conversion sections each configured to correspond to a pixel,
an accumulation section configured to be shared by the multiple photoelectric conversion sections and to accumulate charges generated thereby, and
multiple transistors configured to control reading of the charges accumulated in the accumulation section,
in which the multiple transistors in each of the pixel sharing units are arranged symmetrically, and
the multiple transistors include a transistor that functions as a switch to change conversion efficiency.

(2)
The solid-state imaging device as stated in paragraph (1) above, in which the transistor that functions as the switch is configured to change the conversion efficiency by selectively enabling or disabling additional capacitance with respect to the accumulation section.

(3)
The solid-state imaging device as stated in paragraph (2) above, in which the additional capacitance is configured to include the capacitance of the transistor that functions as the switch and diffusion capacitance.

(4)
The solid-state imaging device as stated in paragraph (3) above, in which the additional capacitance is configured to include wiring capacitance.

(5)
The solid-state imaging device as stated in any one of paragraphs (1) to (4) above, in which each of the pixel sharing units is configured to include a plurality of the accumulation sections.

(6)
The solid-state imaging device as stated in any one of paragraphs (1) to (5) above, in which each of the pixel sharing units is configured to include eight of the photoelectric conversion sections each configured to correspond to a pixel, and two of the accumulation sections configured to be shared by four of the photoelectric conversion sections.

(7)
The solid-state imaging device as stated in any one of paragraphs (1) to (6) above, in which each of the pixel sharing units is configured to include accumulation section wiring configured to connect the accumulation sections, and the accumulation section wiring is configured to be surrounded by a hollow region.

(8)
The solid-state imaging device as stated in any one of paragraphs (1) to (7) above, in which at least part of device isolation is accomplished using an oxide film.

(9)
The solid-state imaging device as stated in any one of paragraphs (1) to (7) above, in which device isolation is accomplished using ion implant.

(10)
An electronic device including a solid-state imaging device having multiple pixel sharing units each configured to include
multiple photoelectric conversion sections each configured to correspond to a pixel,
an accumulation section configured to be shared by the multiple photoelectric conversion sections and to accumulate charges generated thereby, and
multiple transistors configured to control reading of the charges accumulated in the accumulation section,
in which the multiple transistors in each of the pixel sharing units are arranged symmetrically, and
the multiple transistors include a transistor that functions as a switch to change conversion efficiency.

REFERENCE SIGNS LIST

14a First reset gate
14b Second reset gate
21 First light receiving section
22 Second light receiving section
31 First transistor group
32 Second transistor group
110 Pixel sharing unit

What is claimed is:

1. A solid state imaging device comprising a plurality of pixel sharing units each including:
    a first light receiving section including a plurality of photoelectric conversion sections that are each configured to correspond to a pixel;
    a second light receiving section including a plurality of photoelectric conversion sections that are each configured to correspond to a pixel;
    an accumulation section configured to be shared by the plurality of photoelectric conversion sections and to accumulate charges generated thereby; and
    a plurality of transistors configured to control reading of the charges accumulated in the accumulation section and disposed in first and second transistor groups,
    wherein the first transistor group is disposed adjacent a first side of the first light receiving section and between the first light receiving section and the second light receiving section,
    wherein the second transistor group is disposed adjacent a first side of the second light receiving section,
    wherein the plurality of transistors in each of the first and second transistor groups are arranged symmetrically, and
    wherein the second transistor group includes a transistor that functions as a switch to change conversion efficiency.

2. The solid-state imaging device according to claim 1, wherein the transistor that functions as the switch is configured to change the conversion efficiency by selectively enabling or disabling additional capacitance with respect to the accumulation section.

3. The solid-state imaging device according to claim 2, wherein the additional capacitance is configured to include the capacitance of the transistor that functions as the switch and diffusion capacitance.

4. The solid-state imaging device according to claim 3, wherein the additional capacitance is configured to include wiring capacitance.

5. The solid-state imaging device according to claim 2, wherein each of the pixel sharing units is configured to include a plurality of the accumulation sections.

6. The solid-state imaging device according to claim 2, wherein each of the pixel sharing units is configured to include
    eight of the photoelectric conversion sections each configured to correspond to a pixel, and
    two of the accumulation sections configured to be shared by four of the photoelectric conversion sections.

7. The solid-state imaging device according to claim 2, wherein each of the pixel sharing units is configured to include accumulation section wiring configured to connect a plurality of the accumulation sections, and
    the accumulation section wiring is configured to be surrounded by a hollow region.

8. The solid-state imaging device according to claim 2, wherein at least part of device isolation is accomplished using an oxide film.

9. The solid-state imaging device according to claim 2, wherein device isolation is accomplished using ion implantation.

10. An electronic device comprising a solid-state imaging device having a plurality of pixel sharing units each configured to include:
    a first light receiving section including a plurality of photoelectric conversion sections that are each configured to correspond to a pixel;
    a second light receiving section including a plurality of photoelectric conversion sections that are each configured to correspond to a pixel;
    an accumulation section configured to be shared by the plurality of photoelectric conversion sections and to accumulate charges generated thereby; and
    a plurality of transistors configured to control reading of the charges accumulated in the accumulation section and disposed in first and second transistor groups,
    wherein the first transistor group is disposed adjacent a first side of the first light receiving section and between the first light receiving section and the second light receiving section,
    wherein the second transistor group is disposed adjacent a first side of the second light receiving section,
    wherein the plurality of transistors in each of the first and second transistor groups are arranged symmetrically, and
    wherein the second transistor group includes a transistor that functions as a switch to change conversion efficiency.

11. The solid-state imaging device according to claim 1, wherein the plurality of transistors in the first and second transistor groups are symmetrical in that they form a symmetrical layout in which a source/drain region, a pixel transistor, a source/drain region, a pixel transistor, and a source drain region are disposed in that order.

12. The solid-state imaging device according to claim 1, wherein each of the light receiving sections includes four photoelectric conversion sections.

13. The electronic device according to claim 10, wherein the transistor that functions as the switch is configured to change the conversion efficiency by selectively enabling or disabling additional capacitance with respect to the accumulation section.

14. The electronic device according to claim 13, wherein the additional capacitance is configured to include the capacitance of the transistor that functions as the switch and diffusion capacitance.

15. The electronic device according to claim 14, wherein the additional capacitance is configured to include wiring capacitance.

16. The electronic device according to claim 13, wherein each of the pixel sharing units is configured to include a plurality of the accumulation sections.

17. The electronic device according to claim 13, wherein each of the pixel sharing units is configured to include
    eight of the photoelectric conversion sections each configured to correspond to a pixel, and
    two of the accumulation sections configured to be shared by four of the photoelectric conversion sections.

18. The electronic device according to claim 13, wherein each of the pixel sharing units is configured to include accumulation section wiring configured to connect a plurality of the accumulation sections, and
    the accumulation section wiring is configured to be surrounded by a hollow region.

19. The electronic device according to claim 13, wherein at least part of device isolation is accomplished using an oxide film.

20. The electronic device according to claim 13, wherein device isolation is accomplished using ion implantion.

* * * * *